(12) United States Patent
Jung et al.

(10) Patent No.: US 7,508,270 B2
(45) Date of Patent: Mar. 24, 2009

(54) DIFFERENTIAL-TO-SINGLE-ENDED CONVERTER AND PHASE-LOCKED LOOP CIRCUIT HAVING THE SAME

(75) Inventors: Woo-Young Jung, Yongin-si (KR); Young-Min Kim, Seoul (KR)

(73) Assignee: Samsung Electronics Co., Ltd. (KR)

(*) Notice: Subject to any disclaimer, the term of this patent is extended or adjusted under 35 U.S.C. 154(b) by 156 days.

(21) Appl. No.: 11/653,055

(22) Filed: Jan. 12, 2007

(65) Prior Publication Data

US 2007/0170987 A1      Jul. 26, 2007

(30) Foreign Application Priority Data

Jan. 20, 2006    (KR)    .................. 10-2006-0006363

(51) Int. Cl.
  *H03K 3/03*    (2006.01)
  *H03L 7/099*   (2006.01)
(52) U.S. Cl. .................. 331/1 A; 331/8; 331/57
(58) Field of Classification Search .............. 331/1 A, 331/8, 16–18, 25, 34, 57
See application file for complete search history.

(56) References Cited

U.S. PATENT DOCUMENTS

| | | | |
|---|---|---|---|
| 4,965,468 A | * | 10/1990 | Nicollini et al. ............... 327/89 |
| 5,606,268 A | | 2/1997 | Van Brunt |
| 6,720,830 B2 | | 4/2004 | Andreou et al. |
| 6,809,566 B1 | | 10/2004 | Xin-LeBlanc |

FOREIGN PATENT DOCUMENTS

KR    10-2005-0009156    1/2005

* cited by examiner

*Primary Examiner*—David Mis
(74) *Attorney, Agent, or Firm*—Mills & Onello LLP

(57) ABSTRACT

In a differential-to-single-ended (D2S) converter having reduced power consumption and excellent duty ratio characteristics, and a phase-locked loop (PLL) circuit having the same, the D2S converter includes a differential amplifier and a latch circuit. The differential amplifier amplifies a differential input signal to generate a differential output signal. The latch circuit latches the differential output signal to generate a single output signal. A bias current of the differential amplifier may be determined according to a bias voltage proportional to a voltage which is provided to a delay cell of a voltage-controlled oscillator (VCO). The D2S converter may have reduced power consumption and excellent duty ratio characteristics, and the PLL circuit having the D2S converter may have a simple circuit configuration and less power consumption.

24 Claims, 11 Drawing Sheets

DIFFERENTIAL-TO-SINGLE-ENDED CONVERTER AND PHASE-LOCKED LOOP CIRCUIT HAVING THE SAME

CROSS-REFERENCE TO RELATED APPLICATIONS

This application claims priority under 35 USC § 119 to Korean Patent Application No. 10-2006-0006363 filed on Jan. 20, 2006, in the Korean Intellectual Property Office, the contents of which are herein incorporated by reference in its entirety.

BACKGROUND OF THE INVENTION

1. Field of the Invention

The present invention relates to a differential-to-single-ended converter and a phase-locked loop circuit having the same, and more particularly to a differential-to-single-ended converter having reduced power consumption and excellent duty ratio characteristics and a phase-locked loop circuit having the same.

2. Description of the Related Art

A differential-to-single-ended (D2S) converter located in a latter part of a voltage-controlled oscillator (VCO) may have a large influence on characteristics of a phase-locked loop (PLL) circuit. For example, the D2S converter has a significant effect on a duty ratio of an output signal, an operating voltage range, and power consumption in the PLL circuit. The operating voltage range and power consumption in the PLL circuit, respectively, have a trade-off relationship with each other.

FIG. 1 is a circuit diagram illustrating a conventional D2S converter.

Referring to FIG. 1, the D2S converter includes an amplification terminal configured with an N-type metal-oxide semiconductor (NMOS) transistor MN1 and P-type MOS (PMOS) transistors MP1 and MP2, and another amplification terminal configured with an NMOS transistor MN2 and PMOS transistors MP3 and MP4. An output current of the PMOS transistor MP2 and an output current of the PMOS transistor MP4 are compared by a current-mirror circuit configured with NMOS transistors MN3 and MN4, and thus a difference between the output currents are outputted as a single output voltage FOUT.

However, in the conventional D2S converter, power consumption is large in a case where a voltage swing of the single output voltage FOUT is large.

Therefore, a D2S converter having excellent duty ratio characteristics while having reduced power consumption is required.

SUMMARY OF THE INVENTION

Accordingly, the present invention is provided to substantially obviate one or more problems due to limitations and disadvantages of the related art.

Example embodiments of the present invention provide a differential-to-single-ended (D2S) converter having reduced power consumption and excellent duty ratio characteristics.

Example embodiments of the present invention also provide a voltage-controlled oscillator (VCO) including the D2S converter having reduced power consumption and excellent duty ratio characteristics.

Example embodiments of the present invention also provide a phase-locked loop (PLL) circuit including the D2S converter having reduced power consumption and excellent duty ratio characteristics.

According to one aspect, the present invention is directed to a D2S converter which includes a differential amplifier configured to amplify a differential input signal to generate a differential output signal; and a latch circuit configured to latch the differential output signal to generate a single output signal.

In one embodiment of the present invention, a bias current of the differential amplifier may be determined according to a bias voltage proportional to a voltage that is provided to a delay cell of a VCO.

In one embodiment, the differential amplifier comprises: a first transistor including a control terminal to which a first input signal is applied, a first output terminal coupled to a first node, and a second output terminal to which a first power supply voltage is applied, and having a first conductive type; a second transistor including a control terminal to which a second input signal having an opposite phase from the first input signal is applied, a first output terminal coupled to a second node, and a second output terminal to which the first power supply voltage is applied, and having the first conductive type; a third transistor including a control terminal to which the bias voltage is applied, a first output terminal coupled to the first node, and a second output terminal to which a second power supply voltage is applied, and having a second conductive type which is opposite from the first conductive type; and a fourth transistor including a control terminal to which the bias voltage is applied, a first output terminal coupled to the second node, and a second output terminal to which the second power supply voltage is applied, and having the second conductive type.

In one embodiment, a first output signal is outputted from the first node and a second output signal having an opposite phase from the first output signal is outputted from the second node.

In one embodiment, the transistor having the first conductive type is an N-type metal-oxide semiconductor (NMOS) transistor and the transistor having the second conductive type is a P-type MOS (PMOS) transistor.

In one embodiment, the latch circuit comprises: a fifth transistor including a control terminal coupled to the second node, a first output terminal coupled to the first node, and a second output terminal to which the second power supply voltage is applied, and having the second conductive type; and a sixth transistor including a control terminal coupled to the first node, a first output terminal coupled to the second node, and a second output terminal to which the second power supply voltage is applied, and having the second conductive type. The single output signal is outputted from the second node.

In one embodiment, the differential amplifier comprises: a first transistor including a control terminal to which a first input signal is applied, a first output terminal coupled to a first node, and a second output terminal to which a first power supply voltage is applied, and having a first conductive type; a second transistor including a control terminal to which a second input signal having an opposite phase from the first input signal is applied, a first output terminal coupled to a second node, and a second output terminal to which the first power supply voltage is applied, and having the first conductive type; a third transistor including a control terminal to which the second input signal is applied and a first output terminal coupled to the first node, and having the first conductive type; a fourth transistor including a control terminal to which the first input signal is applied and a first output terminal coupled to the second node, and having the first conductive type; a fifth transistor including a control terminal to which the bias voltage is applied, a first output terminal coupled to a second output terminal of the third transistor, and a second output terminal to which a second power supply voltage is applied, and having a second conductive type which is opposite from the first conductive type; and a sixth transistor including a control terminal to which the bias voltage is applied, a first output terminal coupled to a second output terminal of the fourth transistor, and a second output terminal to which the second power supply voltage is applied, and having the second conductive type.

In one embodiment, a first output signal is outputted from the first node and a second output signal having an opposite phase from the first output signal is outputted from the second node.

In one embodiment, the transistor having the first conductive type is an NMOS transistor and the transistor having the second conductive type is a PMOS transistor.

In one embodiment, the latch circuit comprises: a seventh transistor including a control terminal coupled to the second node, a first output terminal coupled to the first node, and a second output terminal to which the second power supply voltage is applied, and having the second conductive type; and an eighth transistor including a control terminal coupled to the first node, a first output terminal coupled to the second node, and a second output terminal to which the second power supply voltage is applied, and having the second conductive type. The single output signal is outputted from the second node.

In one embodiment, the D2S converter further comprises a buffer circuit configured to buffer the single output signal.

According to another aspect, the present invention is directed to a VCO which includes a voltage converter configured to generate a cell power supply voltage varying according to a control voltage; a delay circuit configured to generate a differential input signal having a delay time which varies according to the cell power supply voltage; and a D2S converter configured to receive the differential input signal to generate a single output signal. The D2S converter includes a differential amplifier configured to amplify the differential input signal to generate a differential output signal; and a latch circuit configured to latch the differential output signal to generate the single output signal.

In one embodiment, a bias current of the differential amplifier is determined according to a bias voltage proportional to a voltage which is provided to a delay cell of the VCO.

In one embodiment, the differential amplifier comprises: a first transistor including a control terminal to which a first input signal is applied, a first output terminal coupled to a first node, and a second output terminal to which a first power supply voltage is applied, and having a first conductive type; a second transistor including a control terminal to which a second input signal having an opposite phase from the first input signal is applied, a first output terminal coupled to a second node, and a second output terminal to which the first power supply voltage is applied, and having the first conductive type; a third transistor including a control terminal to which the bias voltage is applied, a first output terminal coupled to the first node, and a second output terminal to which a second power supply voltage is applied, and having a second conductive type which is opposite from the first conductive type; and a fourth transistor including a control terminal to which the bias voltage is applied, a first output terminal coupled to the second node, and a second output terminal to which the second power supply voltage is applied, and having the second conductive type.

In one embodiment, a first output signal is outputted from the first node and a second output signal having an opposite phase from the first output signal is outputted from the second node.

In one embodiment, the transistor having the first conductive type is an NMOS transistor and the transistor having the second conductive type is a PMOS transistor.

In one embodiment, the latch circuit comprises: a fifth transistor including a control terminal coupled to the second node, a first output terminal coupled to the first node, and a second output terminal to which the second power supply voltage is applied, and having the second conductive type; and a sixth transistor including a control terminal coupled to the first node, a first output terminal coupled to the second node, and a second output terminal to which the second power supply voltage is applied, and having the second conductive type. The single output signal is outputted from the second node.

In one embodiment, the differential amplifier comprises: a first transistor including a control terminal to which a first input signal is applied, a first output terminal coupled to a first node, and a second output terminal to which a first power supply voltage is applied, and having a first conductive type; a second transistor including a control terminal to which a second input signal having an opposite phase from the first input signal is applied, a first output terminal coupled to a second node, and a second output terminal to which the first power supply voltage is applied, and having the first conductive type; a third transistor including a control terminal to which the second input signal is applied and a first output terminal coupled to the first node, and having the first conductive type; a fourth transistor including a control terminal to which the first input signal is applied and a first output terminal coupled to the second node, and having the first conductive type; a fifth transistor including a control terminal to which the bias voltage is applied, a first output terminal coupled to a second output terminal of the third transistor, and a second output terminal to which a second power supply voltage is applied, and having a second conductive type which is opposite from the first conductive type; and a sixth transistor including a control terminal to which the bias voltage is applied, a first output terminal coupled to a second output terminal of the fourth transistor, and a second output terminal to which the second power supply voltage is applied, and having the second conductive type.

In one embodiment, a first output signal is outputted from the first node and a second output signal having an opposite phase from the first output signal is outputted from the second node.

In one embodiment, the transistor having the first conductive type is an NMOS transistor and the transistor having the second conductive type is a PMOS transistor.

In one embodiment, the latch circuit comprises: a seventh transistor including a control terminal coupled to the second node, a first output terminal coupled to the first node, and a second output terminal to which the second power supply voltage is applied, and having the second conductive type; and an eighth transistor including a control terminal coupled to the first node, a first output terminal coupled to the second node, and a second output terminal to which the second power supply voltage is applied, and having the second conductive type. The single output signal is outputted from the second node.

In one embodiment, the D2S converter further comprises a buffer circuit configured to buffer the single output signal.

According to another aspect, the present invention is directed to a PLL circuit which includes a phase/frequency detector configured to compare phases and frequencies of a reference voltage and a feedback voltage, and detect a phase difference between the reference voltage and feedback voltage to generate an up signal and a down signal; a charge pump configured to generate a current signal in response to the up signal and the down signal; a low-pass filter configured to perform a low-pass filtering on the current signal and generate a control voltage; a VCO configured to generate a voltage signal having a frequency which varies according to the control voltage; and a frequency divider configured to divide the frequency of the voltage signal to generate the feedback voltage. The VCO includes a voltage converter configured to generate a cell power supply voltage varying according to the control voltage; a delay circuit configured to generate a differential input signal having a delay time which varies according to the cell power supply voltage; and a D2S converter configured to convert the differential input signal to a single output signal. The D2S converter includes a differential amplifier configured to amplify the differential input signal to generate a differential output signal; and a latch circuit configured to latch the differential output signal to generate the single output signal.

In one embodiment, a bias current of the differential amplifier is determined according to a bias voltage proportional to a voltage that is provided to a delay cell of a VCO.

The D2S converter according to the invention has reduced power consumption and excellent duty ratio characteristics, and the PLL circuit having the D2S converter may have a simple circuit configuration and less power consumption.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DESCRIPTION OF THE EMBODIMENTS

Embodiments of the present invention now will be described more fully with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
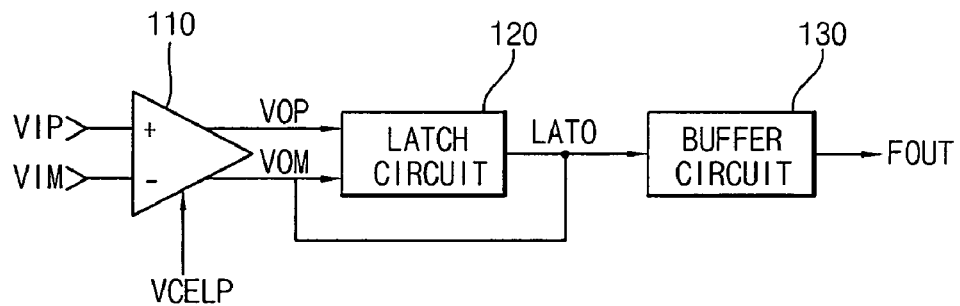
FIG. 2 is a block diagram illustrating a D2S converter according to an example embodiment of the present invention.

FIG. 2 is a block diagram illustrating a differential-to-single-ended (D2S) converter according to an example embodiment of the present invention.

Referring to FIG. 2, a D2S 100 includes a differential amplifier 110 and a latch circuit 120.

The differential amplifier 110 amplifies differential input signals VIP and VIM to generate differential output signals VOP and VOM. The latch circuit 120 latches the differential output signals VOP and VOM to generate a single output signal LATO. A bias current of the differential amplifier 110 may be determined in response to a bias voltage VCELP that is proportional to a cell power supply voltage being provided to a delay cell of a voltage-controlled oscillator (VCO) (not shown).

In addition, the D2S 100 may further include a buffer circuit 130 buffering the single output signal LATO.

Figure 3:
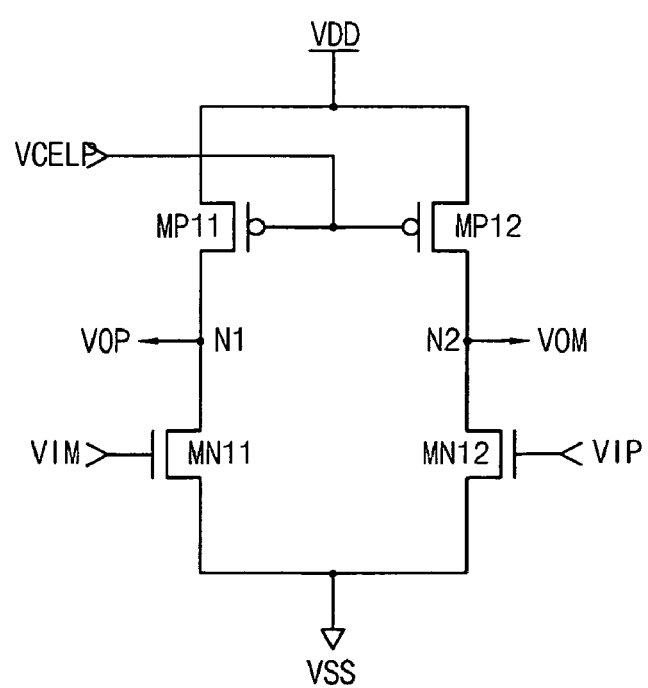
FIG. 3 is a circuit diagram illustrating the differential amplifier in FIG. 2 according to an example embodiment of the present invention.

FIG. 3 is a circuit diagram illustrating the differential amplifier in FIG. 2 according to an example embodiment of the present invention.

Referring to FIG. 3, the differential amplifier 110 includes N-type metal-oxide semiconductor (NMOS) transistors MN11 and MN12, and P-type MOS (PMOS) transistors MP11 and MP12.

The NMOS transistor MN11 has a gate to which a negative differential input signal VIM is applied, a drain coupled to a node N1, and a source to which a low power supply voltage VSS is applied. The NMOS transistor MN12 has a gate to which a positive differential input signal VIP is applied, a drain coupled to a node N2, and a source to which the low power supply voltage VSS is applied. The PMOS transistor MP11 has a gate to which a bias voltage VCELP is applied, a drain coupled to the node N1, and a source to which a high power supply voltage VDD is applied. The PMOS transistor MP12 has a gate to which the bias voltage VCELP is applied, a drain coupled to the node N2, and a source to which the high power supply voltage VDD is applied.

A positive differential output signal VOP is outputted from the node N1, and a negative differential output signal VOM is outputted from the node N2.

Figure 4:
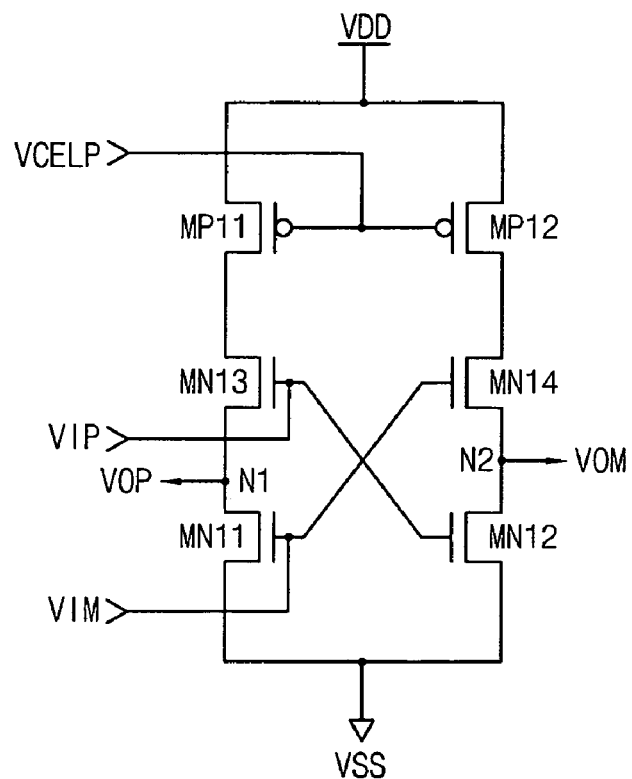
FIG. 4 is a circuit diagram illustrating the differential amplifier in FIG. 2 according to another example embodiment of the present invention.

FIG. 4 is a circuit diagram illustrating the differential amplifier in FIG. 2 according to another example embodiment of the present invention.

Referring to FIG. 4, the differential amplifier 110 includes NMOS transistors MN11, MN12, MN13 and MN14, and PMOS transistors MP11 and MP12.

The NMOS transistor MN11 has a gate to which a negative differential input signal VIM is applied, a drain coupled to a node N1, and a source to which a low power supply voltage VSS is applied. The NMOS transistor MN12 has a gate to which a positive differential input signal VIP is applied, a drain coupled to a node N2, and a source to which the low power supply voltage VSS is applied. The NMOS transistor MN13 has a gate to which the positive differential input signal VIP is applied, and a source coupled to the node N1. The NMOS transistor MN14 has a gate to which the negative differential input signal VIM is applied, and a source coupled to the node N2. The PMOS transistor MP11 has a gate to which a bias voltage VCELP is applied, a drain coupled to a drain of the NMOS transistor MN13, and a source to which a high power supply voltage VDD is applied. The PMOS transistor MP12 has a gate to which the bias voltage VCELP is applied, a drain coupled to the drain of the NMOS transistor MN13, and a source to which the high power supply voltage VDD is applied.

A positive differential output signal VOP is outputted from the node N1, and a negative differential output signal VOM is outputted from the node N2.

Figure 5:
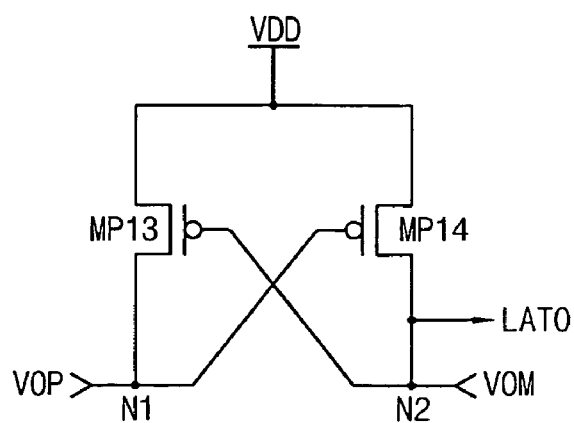
FIG. 5 is a circuit diagram illustrating the latch circuit in FIG. 2 according to an example embodiment of the present invention.

FIG. 5 is a circuit diagram illustrating the latch circuit in FIG. 2 according to an example embodiment of the present invention.

Referring to FIG. 5, the latch circuit 120 includes PMOS transistors MP13 and MP14. The PMOS transistor MP13 has a gate coupled to a node N2, a drain coupled to a node N1, and a source to which a high power supply voltage VDD is applied. The PMOS transistor MP14 has a gate coupled to the node N1, a drain coupled to the node N2, and a source to which the high power supply voltage VDD is applied.

A single output signal LATO is outputted from the node N2.

Figure 6:
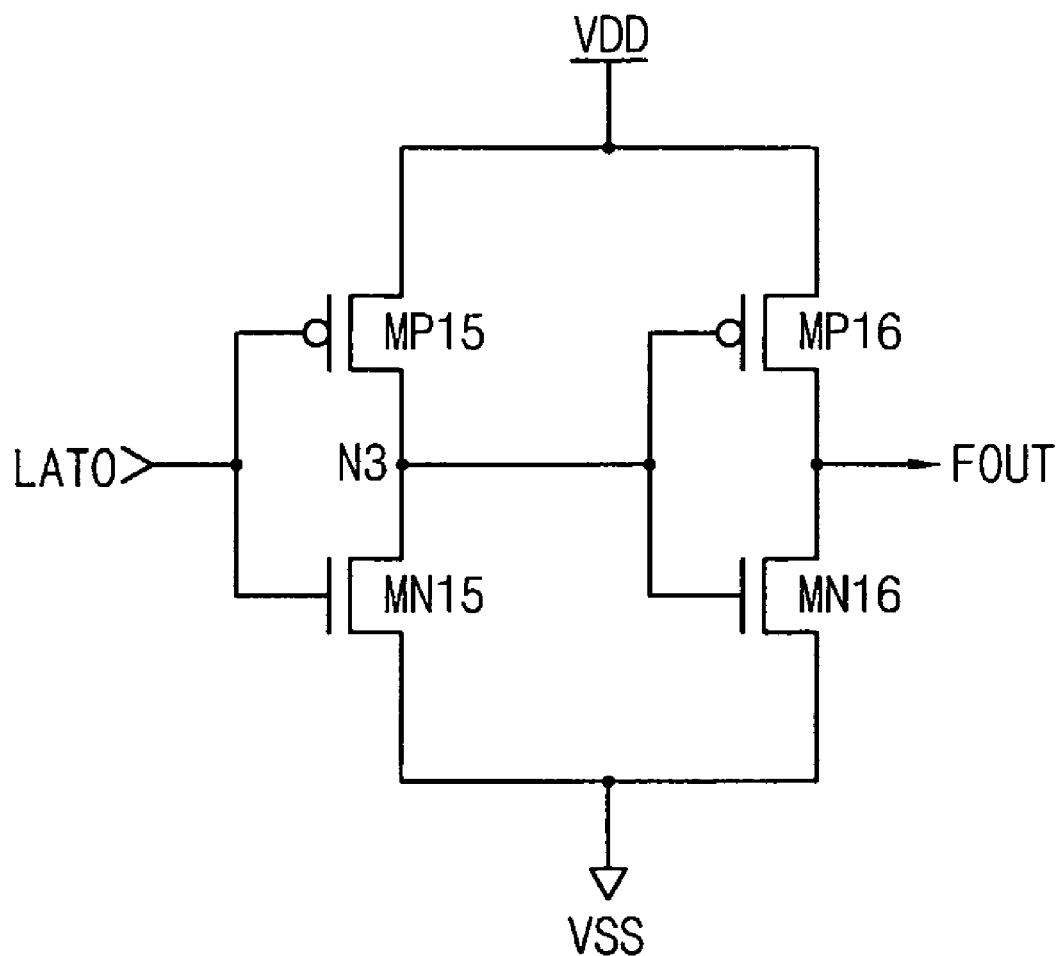
FIG. 6 is a circuit diagram illustrating the buffer circuit in FIG. 2 according to an example embodiment of the present invention.

FIG. 6 is a circuit diagram illustrating the buffer circuit in FIG. 2 according to an example embodiment of the present invention.

Referring to FIG. 6, the buffer circuit 130 includes PMOS transistors MP15 and MP16, and NMOS transistors MN15 and MN16.

The PMOS transistor MP15 and NMOS transistor MN15 constitute an inverter, and the PMOS transistor MP16 and NMOS transistor MN16 constitute an inverter.

A single output signal LATO is buffered by the buffer circuit 130, thereby being outputted as an output voltage FOUT.

The operation of the D2S converter 100 according to an example embodiment of the present invention is described below with reference to FIGS. 2 through 6.

In FIG. 2, the bias voltage VCELP provided to the differential amplifier 110 may be proportional to a cell power supply voltage being provided to a delay cell of a VCO.

Referring to FIG. 3, a bias current that is provided to the differential amplifier 110 through the PMOS transistors MP11 and MP12 varies in response to the bias voltage VCELP. When a control voltage in the VCO varies, the cell power supply voltage being provided to the delay cell of the VCO also varies. Since the bias voltage VCELP is proportional to the cell power supply voltage being provided to the delay cell of the VCO, a voltage swing of the output signal FOUT in the D2S converter 100 varies adaptively to the variation of the control voltage in the VCO. For example, the bias voltage VCELP increases when the control voltage increases, so that the voltage swing of the output signal FOUT in the D2S converter 100 increases. In addition, the bias voltage VCELP decreases when the control voltage decreases, so that the voltage swing of the output signal FOUT in the D2S converter 100 decreases. Therefore, an input voltage by which the D2S converter 100 is triggered may be constant.

Referring to FIGS. 2, 3 and 5, when the negative differential input signal VIM increases and the positive differential input signal VIP decreases, the negative differential output signal VOM increases and the positive differential output signal VOP decreases. Then, the PMOS transistor MP13 is turned off and the PMOS transistor MP14 is turned on in the latch circuit 120 of FIG. 5, so that the negative differential output signal VOM becomes a logic "high" state and the positive differential output signal VOP becomes a logic "low" state. Since the PMOS transistor MP13 is turned off when a current flowing through the NMOS transistor MN11 increases and the PMOS transistor MP14 is turned off when a current flowing through the NMOS transistor MN12 increases, an increase of a dynamic current due to a supplement of the latch circuit 120 may hardly occur.

Referring to FIGS. 2, 4 and 5, when the negative differential input signal VIM increases and the positive differential input signal VIP decreases, the negative differential output signal VOM increases and the positive differential output signal VOP decreases. Then, the PMOS transistor MP13 is turned off and the PMOS transistor MP14 is turned on in the latch circuit 120 of FIG. 5, so that the negative differential output signal VOM becomes a logic "high" state and the positive differential output signal VOP becomes a logic "low" state. Since the PMOS transistor MP13 is turned off when a current flowing through the NMOS transistor MN11 increases and the PMOS transistor MP14 is turned off when a current flowing through the NMOS transistor MN12 increases, an increase of a consumption current due to a supplement of the latch circuit 120 may hardly occur.

Referring to FIG. 4, the NMOS transistors MN13 and MN14 to which the differential input signals VIP and VIM are applied are further included to the differential amplifier in FIG. 3. The NMOS transistors MN11 and MN13 constitute a differential switch, and the NMOS transistors MN12 and MN14 constitute a differential switch. That is, a current flowing through the NMOS transistor MN13 decreases when a current flowing through the NMOS transistor MN11 increases, and the current flowing through the NMOS transistor MN13 increases when the current flowing through the NMOS transistor MN11 decreases. Similarly, a current flowing through the NMOS transistor MN14 decreases when a current flowing through the NMOS transistor MN12 increases, and the current flowing through the NMOS transistor MN14 increases when the current flowing through the NMOS transistor MN12 decreases.

Therefore, duty ratio characteristics of the D2S converter including the differential amplifier 110 in FIG. 4 and latch circuit 120 in FIG. 5 may be excellent.

Figure 7:
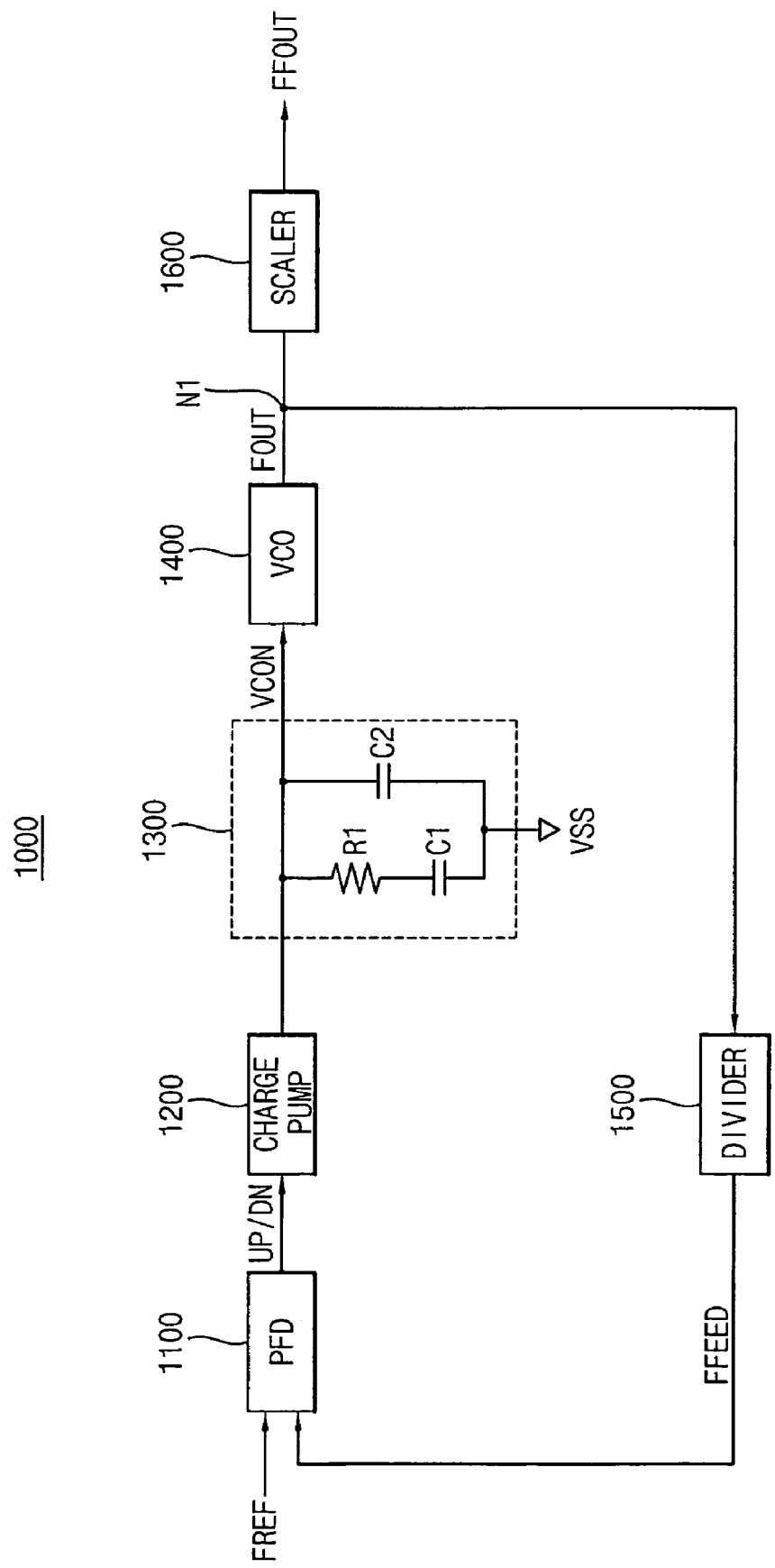
FIG. 7 is a circuit diagram illustrating a phase-locked loop (PLL) circuit having the D2S converter in FIG. 2 according to an example embodiment of the present invention.

FIG. 7 is a circuit diagram illustrating a phase-locked loop (PLL) circuit having the D2S converter in FIG. 2 according to an example embodiment of the present invention.

Referring to FIG. 7, a PLL circuit 1000 includes a phase frequency detector (PFD) 1100, a charge pump 1200, a low-pass filter 1300, a VCO 1400 and a first frequency divider (DIVIDER) 1500. The low-pass filter 1300 includes a resistor R1, and capacitors C1 and C2. In addition, the PLL circuit 1000 may further include a second frequency divider (SCALER) 1600.

The PFD 1100 compares phases and frequencies of a reference voltage (FREF) and a feedback voltage (FFEED), and then detects a phase difference between the FREF and FFEED to generate an up signal UP and a down signal DN. The charge pump 1200 generates a current signal in response to the up signal UP and down signal DN. The low-pass filter 1300 performs a low-pass filtering on an output signal of the charge pump 1200 and generates a control voltage VCON. The VCO 1400 generates a voltage signal FOUT having a frequency that varies according to the control voltage VCON. The first frequency divider 1500 divides a frequency of the voltage signal FOUT to generate the feedback voltage (FFEED), and the second frequency divider 1600 divides the frequency of the voltage signal FOUT to generate a final output signal FFOUT.

The PLL circuit 1000 in FIG. 7 generates an output voltage FFOUT that is phase-locked with the reference voltage (FREF) by a PLL. The first frequency divider 1500 increases the frequency of the output signal FOUT of the VCO, and the second frequency divider 1600 decreases the frequency of the output signal FOUT of the VCO.

Figure 8:
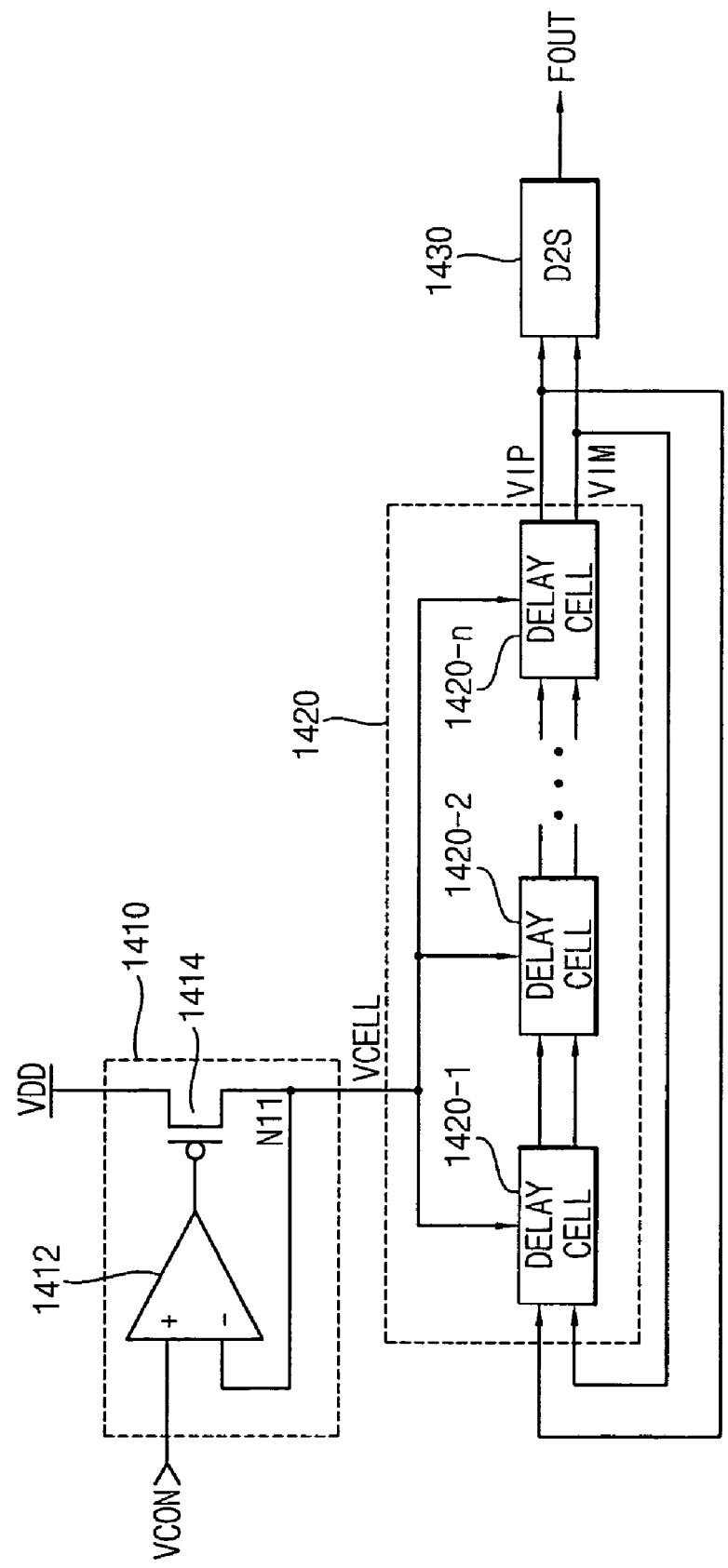
FIG. 8 is a circuit diagram illustrating the voltage-controlled oscillator (VCO) in FIG. 7 according to an example embodiment of the present invention.

FIG. 8 is a circuit diagram illustrating the VCO in FIG. 7 according to an example embodiment of the present invention.

Referring to FIG. 8, the VCO 1400 includes a voltage converter 1410, a delay circuit 1420 and a D2S converter 1430.

The voltage converter 1410 generates a cell power supply voltage VCELL varying according to a control voltage VCON. The delay circuit 1420 generates differential input signals VIP and VIM having delay times varying according to the cell power supply voltage VCELL. The D2S 1430 converts the differential input signals VIP and VIM to a single output signal FOUT.

The voltage converter 1410 includes a differential amplifier 1412 and a PMOS transistor 1414.

The differential amplifier 1412 amplifies a voltage difference between the control voltage VCON and a node N11. The PMOS transistor 1414 changes a voltage potential at the node N11 in response to an output signal of the differential amplifier 1412.

The delay circuit 1420 includes delay cells (1420-1 through 1420-n) that are cascade-coupled, respectively.

The D2S converter 1430 in FIG. 8 has substantially the same circuit configuration as the D2S 100 in FIG. 2.

Figure 9:
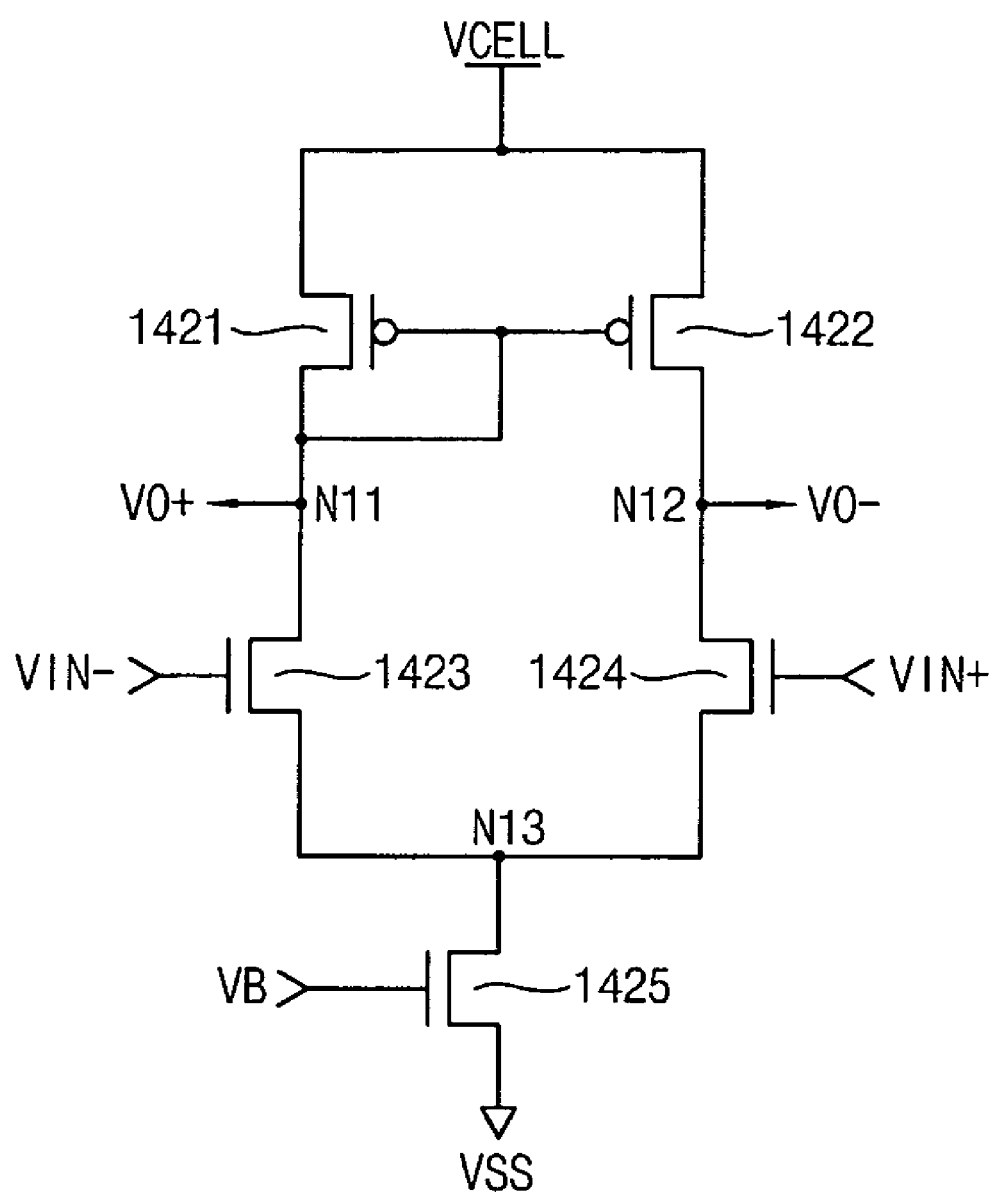
FIG. 9 is a circuit diagram illustrating one of the delay cells constituting the delay circuit in FIG. 8 according to an example embodiment of the present invention.

FIG. 9 is a circuit diagram illustrating one of the delay cells constituting the delay circuit in FIG. 8 according to an example embodiment of the present invention.

A delay cell 1420-n includes NMOS transistors 1423, 1424 and 1425, and PMOS transistors 1421 and 1422.

The NMOS transistor 1425 has a gate to which a bias voltage VB is applied, a drain coupled to a node N13, and a source to which a low power supply voltage VSS is applied. The NMOS transistor 1423 has a gate to which a negative differential input signal VIN− is applied, a drain coupled to a node N11, and a source coupled to the node N13. The NMOS transistor 1424 has a gate to which a positive differential input signal VIN+ is applied, a drain coupled to a node N12, and a source coupled to the node N13. The PMOS transistor 1421 has a gate and a drain commonly coupled to the node N11, and a source to which a cell power supply voltage VCELL is applied. The PMOS transistor 1422 has a gate coupled to the node N11, a drain coupled to the node N12, and a source to which the cell power supply voltage VCELL is applied.

A positive differential output signal VO+ is outputted from the node N11, and a negative differential output signal VO− is outputted from the node N12.

The delay cell 1420-n in FIG. 9 has a configuration of a differential amplifier, and receives and amplifies the differential input signals VIN− and VIN+ to output the differential output signals VO+ and VO−. A delay time that is delayed by the delay cell 1420-n varies according to a variation of the cell power supply voltage VCELL.

The operation of the VCO 1400 to which the D2S converter is adapted according to an example embodiment of the present invention is described below with reference to FIGS. 8 and 9.

In FIG. 8, the cell power supply voltage VCELL that is output from the voltage converter 1410 varies in response to the control voltage VCON. When the cell power supply voltage VCELL that is provided to the delay cells (1420-1 through 1420-n) constituting the delay circuit 1420 varies, a delay time that is delayed by the delay circuit 1420 also varies.

For example, the cell power supply voltage VCELL decreases when the control voltage VCON increases, so that the delay time that is delayed by the delay circuit 1420 increases. In addition, the cell power supply voltage VCELL increases when the control voltage VCON decreases, so that the delay time that is delayed by the delay circuit 1420 decreases.

The D2S converter 1430 has substantially the same circuit configuration as the D2S 100 in FIG. 2, and converts the differential input signals VIP and VIM to the single output signal FOUT. The D2S 100 in FIG. 2 includes a latch circuit, and has a simple circuit configuration, less power consumption and good duty ratio characteristics. Thus, the output signal FOUT of the VCO 1400 has merits in that the duty ratio characteristics may be good and the power consumption may be reduced.

Figure 10A:
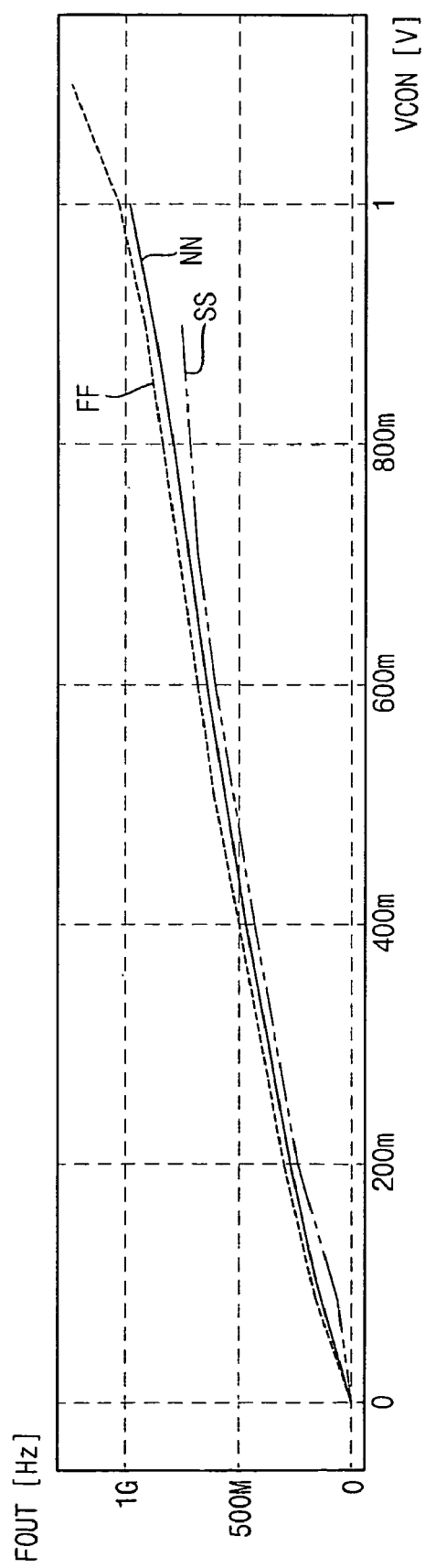
FIG. 10A is a graph illustrating a relationship between a control voltage and a frequency of an output voltage with respect to the VCO in FIG. 8, under simulation conditions.
Figure 10B:
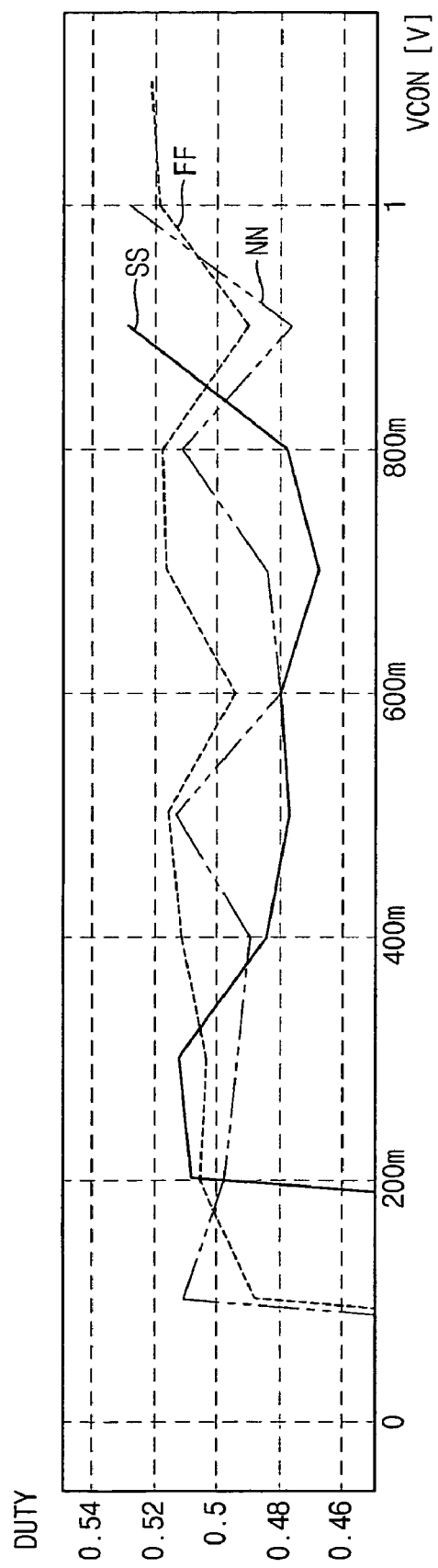
FIG. 10B is a graph illustrating a relationship between a control voltage and a duty ratio with respect to the VCO in FIG. 8, under simulation conditions.
Figure 10C:
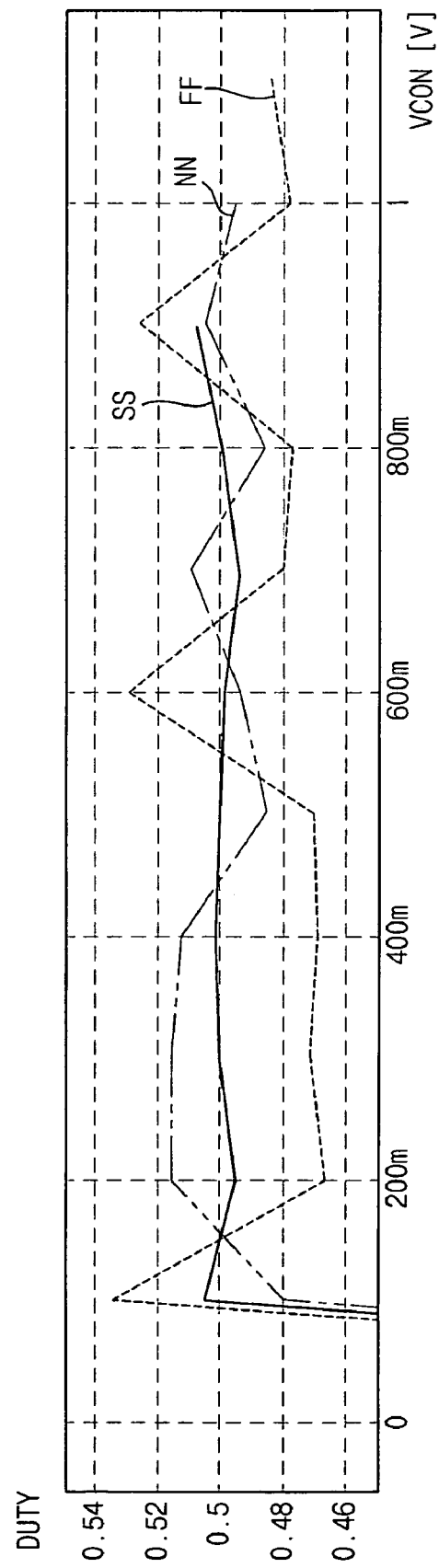
FIG. 10C is a graph illustrating a relationship between a control voltage and a duty ratio with respect to a VCO including the conventional D2S illustrated in FIG. 1, under simulation conditions.

FIGS. 10A through 10C are graphs illustrating variations of a frequency and a duty ratio of an output voltage according to a variation of a control voltage of a VCO according to an example embodiment of the present invention, when simulation conditions are changed.

In FIGS. 10A through 10C, the simulation conditions include a fast condition FF, a normal condition NN and a slow condition SS. The fast condition FF indicates that transistors included in the circuit had a low threshold voltage and a fast response speed, a test temperature was 125° C., and an operating voltage was 1.1 V. The normal condition NN indicates that transistors included in the circuit had a medium threshold voltage and a medium response speed, a test temperature was 55° C., and an operating voltage was 1.0 V. The slow condition SS indicates that transistors included in the circuit had a high threshold voltage and a slow response speed, a test temperature was −45° C., and an operating voltage was 0.9 V.

FIG. 10A is a graph illustrating a relationship between a control voltage and a frequency of an output voltage with respect to the VCO in FIG. 8, under simulation conditions.

Referring to FIG. 10A, the frequency of the output voltage (FOUT) varies linearly according to the variation of the control voltage (VCON).

FIG. 10B is a graph illustrating a relationship between a control voltage and a duty ratio with respect to the VCO in FIG. 8, under simulation conditions.

Referring to FIG. 10B, the duty ratio is in the range of about 0.48 through about 0.52 and may be about 0.5.

Figure 1:
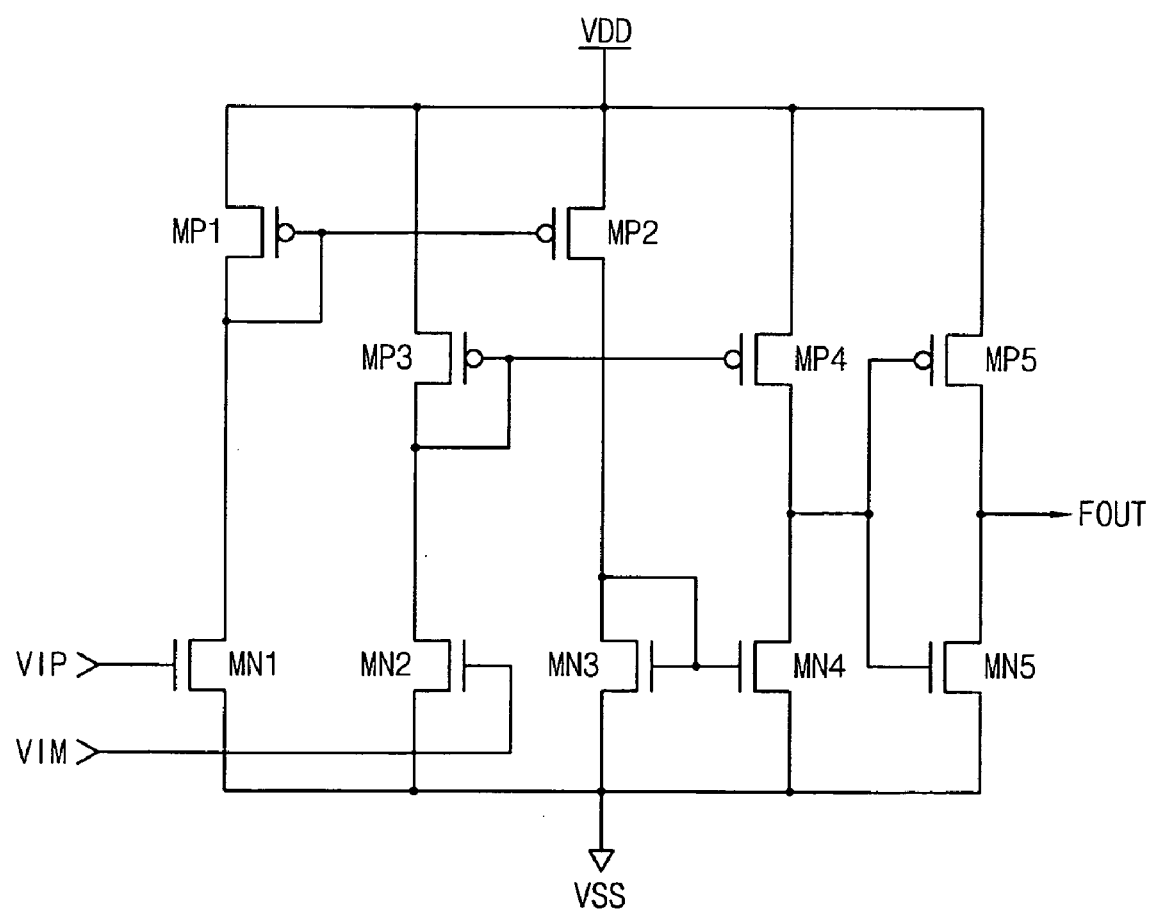
FIG. 1 is a circuit diagram illustrating a conventional differential-to-single-ended (D2S) converter.

FIG. 10C is a graph illustrating a relationship between a control voltage and a duty ratio with respect to a VCO including the conventional D2S illustrated in FIG. 1, under simulation conditions.

Referring to FIG. 10C, the duty ratio is in the range of about 0.48 through about 0.52 and may be about 0.5.

Referring to FIGS. 10A through 10C, in the VCO of FIG. 8 according to an example embodiment of the present invention, the frequency of the output voltage varies linearly according to the variation of the control voltage and the duty ratio has similar characteristics to the duty ratio of the VCO including the conventional D2S.

Figure 11:
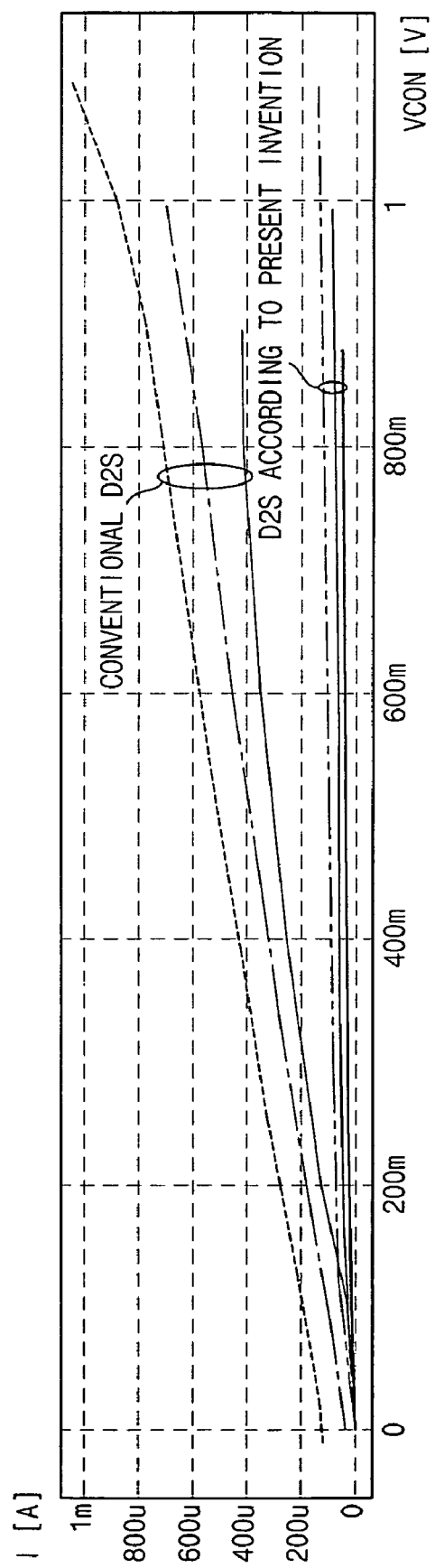
FIG. 11 is a graph illustrating a relationship between a control voltage and a consumption current, with respect to the conventional D2S converter illustrated in FIG. 1 and the D2S converter according to an example embodiment of the present invention illustrated in FIG. 2.

FIG. 11 is a graph illustrating a relationship between the control voltage and consumption current, with respect to the conventional D2S converter illustrated in FIG. 1 and the D2S converter according to an example embodiment of the present invention illustrated in FIG. 2.

In FIG. 11, a simulation result is also illustrated under simulation conditions including the fast condition FF, normal condition NN and slow condition SS as illustrated in FIGS. 10A through 10C.

As shown in FIG. 11, it may be noted that the consumption current in the D2S converter according to an example embodiment of the present invention is less than the consumption current in the conventional D2S converter.

As described above, a D2S converter according to the present invention includes a latch circuit and a differential amplifier in which a bias voltage proportional to a control voltage of a VCO is provided, thereby having reduced power consumption and excellent duty ratio characteristics. Therefore, a PLL circuit having the D2S converter may have a simple circuit configuration and less power consumption.

Having thus described example embodiments of the present invention, it is to be understood that the invention defined by the appended claims is not to be limited by particular details set forth in the above description as many apparent variations thereof are possible without departing from the spirit or scope thereof as hereinafter claimed.

What is claimed is:

1. A differential-to-single-ended (D2S) converter comprising:
    a differential amplifier configured to amplify a differential input signal to generate a differential output signal; and
    a latch circuit configured to latch the differential output signal to generate a single latch output signal,
    wherein the D2S converter generates a single output signal based on the single latch output signal and one end of the differential output signal.

2. The D2S converter of claim 1, wherein a bias current of the differential amplifier is determined according to a bias voltage proportional to a voltage which is provided to a delay cell of a voltage-controlled oscillator (VCO).

3. The D2S converter of claim 1, further comprising a buffer circuit configured to buffer the single output signal.

4. A differential-to-single-ended (D2S) converter comprising:
    a differential amplifier configured to amplify a differential input signal to generate a differential output signal, wherein a bias current of the differential amplifier is determined according to a bias voltage proportional to a voltage which is provided to a delay cell of a voltage-controlled oscillator (VCO); and
    a latch circuit configured to latch the differential output signal to generate a single output signal,
    wherein the differential amplifier comprises:
        a first transistor including a control terminal to which a first input signal is applied, a first output terminal coupled to a first node, and a second output terminal to which a first power supply voltage is applied, and having a first conductive type;
        a second transistor including a control terminal to which a second input signal having an opposite phase from the first input signal is applied, a first output terminal coupled to a second node, and a second output terminal to which the first power supply voltage is applied, and having the first conductive type;
        a third transistor including a control terminal to which the bias voltage is applied, a first output terminal coupled to the first node, and a second output terminal to which a second power supply voltage is applied, and having a second conductive type which is opposite from the first conductive type; and
        a fourth transistor including a control terminal to which the bias voltage is applied, a first output terminal coupled to the second node, and a second output terminal to which the second power supply voltage is applied, and having the second conductive type.

5. The D2S converter of claim 4, wherein a first output signal is outputted from the first node and a second output signal having an opposite phase from the first output signal is outputted from the second node.

6. The D2S converter of claim 4, wherein the transistor having the first conductive type is an N-type metal-oxide semiconductor (NMOS) transistor and the transistor having the second conductive type is a P-type MOS (PMOS) transistor.

7. The D2S converter of claim 5, wherein the latch circuit comprises:
- a fifth transistor including a control terminal coupled to the second node, a first output terminal coupled to the first node, and a second output terminal to which the second power supply voltage is applied, and having the second conductive type; and
- a sixth transistor including a control terminal coupled to the first node, a first output terminal coupled to the second node, and a second output terminal to which the second power supply voltage is applied, and having the second conductive type,
- and wherein the single output signal is outputted from the second node.

8. A differential-to-single-ended (D2S) converter comprising:
- a differential amplifier configured to amplify a differential input signal to generate a differential output signal, wherein a bias current of the differential amplifier is determined according to a bias voltage proportional to a voltage which is provided to a delay cell of a voltage-controlled oscillator (VCO); and
- a latch circuit configured to latch the differential output signal to generate a single output signal,
- wherein the differential amplifier comprises:
  - a first transistor including a control terminal to which a first input signal is applied, a first output terminal coupled to a first node, and a second output terminal to which a first power supply voltage is applied, and having a first conductive type;
  - a second transistor including a control terminal to which a second input signal having an opposite phase from the first input signal is applied, a first output terminal coupled to a second node, and a second output terminal to which the first power supply voltage is applied, and having the first conductive type;
  - a third transistor including a control terminal to which the second input signal is applied and a first output terminal coupled to the first node, and having the first conductive type;
  - a fourth transistor including a control terminal to which the first input signal is applied and a first output terminal coupled to the second node, and having the first conductive type;
  - a fifth transistor including a control terminal to which the bias voltage is applied, a first output terminal coupled to a second output terminal of the third transistor, and a second output terminal to which a second power supply voltage is applied, and having a second conductive type which is opposite from the first conductive type; and
  - a sixth transistor including a control terminal to which the bias voltage is applied, a first output terminal coupled to a second output terminal of the fourth transistor, and a second output terminal to which the second power supply voltage is applied, and having the second conductive type.

9. The D2S converter of claim 8, wherein a first output signal is outputted from the first node and a second output signal having an opposite phase from the first output signal is outputted from the second node.

10. The D2S converter of claim 8, wherein the transistor having the first conductive type is an NMOS transistor and the transistor having the second conductive type is a PMOS transistor.

11. The D2S converter of claim 9, wherein the latch circuit comprises:
- a seventh transistor including a control terminal coupled to the second node, a first output terminal coupled to the first node, and a second output terminal to which the second power supply voltage is applied, and having the second conductive type; and
- an eighth transistor including a control terminal coupled to the first node, a first output terminal coupled to the second node, and a second output terminal to which the second power supply voltage is applied, and having the second conductive type,
- and wherein the single output signal is outputted from the second node.

12. A voltage-controlled oscillator (VCO) comprising:
- a voltage converter configured to generate a cell power supply voltage varying according to a control voltage;
- a delay circuit configured to generate a differential input signal having a delay time which varies according to the cell power supply voltage; and
- a D2S converter configured to receive the differential input signal to generate a single output signal,
- wherein the D2S converter comprises:
  - a differential amplifier configured to amplify the differential input signal to generate a differential output signal; and
  - a latch circuit configured to latch the differential output signal to generate the single output signal.

13. The VCO of claim 12, wherein a bias current of the differential amplifier is determined according to a bias voltage proportional to a voltage which is provided to a delay cell of the VCO.

14. The VCO of claim 13, wherein the differential amplifier comprises:
- a first transistor including a control terminal to which a first input signal is applied, a first output terminal coupled to a first node, and a second output terminal to which a first power supply voltage is applied, and having a first conductive type;
- a second transistor including a control terminal to which a second input signal having an opposite phase from the first input signal is applied, a first output terminal coupled to a second node, and a second output terminal to which the first power supply voltage is applied, and having the first conductive type;
- a third transistor including a control terminal to which the bias voltage is applied, a first output terminal coupled to the first node, and a second output terminal to which a second power supply voltage is applied, and having a second conductive type which is opposite from the first conductive type; and
- a fourth transistor including a control terminal to which the bias voltage is applied, a first output terminal coupled to the second node, and a second output terminal to which the second power supply voltage is applied, and having the second conductive type.

15. The VCO of claim 14, wherein a first output signal is outputted from the first node and a second output signal having an opposite phase from the first output signal is outputted from the second node.

16. The VCO of claim 14, wherein the transistor having the first conductive type is an NMOS transistor and the transistor having the second conductive type is a PMOS transistor.

17. The VCO of claim 15, wherein the latch circuit comprises:
- a fifth transistor including a control terminal coupled to the second node, a first output terminal coupled to the first node, and a second output terminal to which the second power supply voltage is applied, and having the second conductive type; and
- a sixth transistor including a control terminal coupled to the first node, a first output terminal coupled to the second node, and a second output terminal to which the second power supply voltage is applied, and having the second conductive type,
- and wherein the single output signal is outputted from the second node.

18. The VCO of claim 13, wherein the differential amplifier comprises:
- a first transistor including a control terminal to which a first input signal is applied, a first output terminal coupled to a first node, and a second output terminal to which a first power supply voltage is applied, and having a first conductive type;
- a second transistor including a control terminal to which a second input signal having an opposite phase from the first input signal is applied, a first output terminal coupled to a second node, and a second output terminal to which the first power supply voltage is applied, and having the first conductive type;
- a third transistor including a control terminal to which the second input signal is applied and a first output terminal coupled to the first node, and having the first conductive type;
- a fourth transistor including a control terminal to which the first input signal is applied and a first output terminal coupled to the second node, and having the first conductive type;
- a fifth transistor including a control terminal to which the bias voltage is applied, a first output terminal coupled to a second output terminal of the third transistor, and a second output terminal to which a second power supply voltage is applied, and having a second conductive type which is opposite from the first conductive type; and
- a sixth transistor including a control terminal to which the bias voltage is applied, a first output terminal coupled to a second output terminal of the fourth transistor, and a second output terminal to which the second power supply voltage is applied, and having the second conductive type.

19. The VCO of claim 18, wherein a first output signal is outputted from the first node and a second output signal having an opposite phase from the first output signal is outputted from the second node.

20. The VCO of claim 18, wherein the transistor having the first conductive type is an NMOS transistor and the transistor having the second conductive type is a PMOS transistor.

21. The VCO of claim 19, wherein the latch circuit comprises:
- a seventh transistor including a control terminal coupled to the second node, a first output terminal coupled to the first node, and a second output terminal to which the second power supply voltage is applied, and having the second conductive type; and
- an eighth transistor including a control terminal coupled to the first node, a first output terminal coupled to the second node, and a second output terminal to which the second power supply voltage is applied, and having the second conductive type,
- and wherein the single output signal is outputted from the second node.

22. The VCO of claim 12, wherein the D2S converter further comprises a buffer circuit configured to buffer the single output signal.

23. A phase-locked loop (PLL) circuit comprising:
- a phase/frequency detector configured to compare phases and frequencies of a reference voltage and a feedback voltage, and detect a phase difference between the reference voltage and feedback voltage to generate an up signal and a down signal;
- a charge pump configured to generate a current signal in response to the up signal and down signal;
- a low-pass filter configured to perform a low-pass filtering on the current signal and generate a control voltage;
- a voltage-controlled oscillator (VCO) configured to generate a voltage signal having a frequency which varies according to the control voltage; and
- a frequency divider configured to divide the frequency of the voltage signal to generate the feedback voltage,
- wherein the VCO comprises:
  - a voltage converter configured to generate a cell power supply voltage varying according to the control voltage;
  - a delay circuit configured to generate a differential input signal having a delay time which varies according to the cell power supply voltage; and
  - a D2S converter configured to convert the differential input signal to a single output signal,
  - wherein the D2S converter comprises:
    - a differential amplifier configured to amplify the differential input signal to generate a differential output signal; and
    - a latch circuit configured to latch the differential output signal to generate the single output signal.

24. The PLL circuit of claim 23, wherein a bias current of the differential amplifier is determined according to a bias voltage proportional to a voltage that is provided to a delay cell of a VCO.

* * * * *